United States Patent
Nielsen et al.

(10) Patent No.: US 11,765,525 B2
(45) Date of Patent: Sep. 19, 2023

(54) HEARING INSTRUMENT CHARGER DEVICE AND SYSTEM, AND A METHOD OF MANUFACTURING A HOLDER THEREFOR

(71) Applicant: GN Hearing A/S, Ballerup (DK)

(72) Inventors: Henrik Nielsen, Roskilde (DK); Søren Davids, Jyllinge (DK); Thomas John Chappell, Frederiksberg (DK)

(73) Assignee: GN HEARING A/S, Ballerup (DK)

( * ) Notice: Subject to any disclaimer, the term of this patent is extended or adjusted under 35 U.S.C. 154(b) by 377 days.

(21) Appl. No.: 17/120,056

(22) Filed: Dec. 11, 2020

(65) Prior Publication Data
US 2022/0191628 A1 Jun. 16, 2022

(51) Int. Cl.
| | |
|---|---|
| *H04R 25/00* | (2006.01) |
| *H02J 50/12* | (2016.01) |
| *G06F 30/20* | (2020.01) |
| *G06F 30/00* | (2020.01) |
| *G06F 30/17* | (2020.01) |

(52) U.S. Cl.
CPC ............ *H04R 25/55* (2013.01); *G06F 30/20* (2020.01); *H02J 50/12* (2016.02); *H04R 25/30* (2013.01); *G06F 30/00* (2020.01); *G06F 30/17* (2020.01); *H04R 2225/31* (2013.01)

(58) Field of Classification Search
CPC .... H04R 25/55; H04R 25/30; H04R 2225/31; H04R 25/658; H04R 25/602; H04R 25/65; G06F 30/20; G06F 30/00; G06F 30/17; H02J 50/12; H02J 50/10; B29C 64/00

See application file for complete search history.

(56) References Cited

U.S. PATENT DOCUMENTS

| | | |
|---|---|---|
| 5,610,494 A | 3/1997 | Grosfilley |
| 8,137,607 B2 | 3/2012 | Kloeb et al. |

(Continued)

FOREIGN PATENT DOCUMENTS

| | | |
|---|---|---|
| CN | 110112842 | 8/2019 |
| CN | 209234004 | 8/2019 |

(Continued)

OTHER PUBLICATIONS

European Search Report dated Aug. 28, 2020 for EP Appln. No. 20165551.1.

(Continued)

*Primary Examiner* — Tejal Gami
(74) *Attorney, Agent, or Firm* — Vista IP Law Group, LLP

(57) ABSTRACT

A method of manufacturing a charger insert part of a hearing instrument charger device comprising a charger casing having a receiving portion, and a first charger element, includes: obtaining a first virtual model of the rechargeable hearing instrument shaped or to be shaped to at least partly conform to a shape of a portion of an ear canal of a user, wherein the first virtual model comprises an allocated position for a second charger element; obtaining a second virtual model of the charger insert part for manufacturing the charger insert part, such that when the charger insert part is placed in the receiving portion, the first charger element will be in a relation with the second charger element; and shaping, by a manufacturing process, the charger insert part based on the second virtual model, the second virtual model being based on the first virtual model.

30 Claims, 5 Drawing Sheets

(56) References Cited

U.S. PATENT DOCUMENTS

| | | | |
|---|---|---|---|
| 2004/0107080 A1 | 6/2004 | Deichmann et al. | |
| 2008/0292123 A1 | 11/2008 | Jensen | |
| 2009/0010462 A1 | 1/2009 | Ekchian et al. | |
| 2013/0142374 A1* | 6/2013 | Lee | H04R 1/04 |
| | | | 381/361 |
| 2016/0050503 A1 | 2/2016 | Naether | |
| 2017/0127199 A1 | 5/2017 | Marxen et al. | |
| 2018/0123367 A1* | 5/2018 | Higgins | H01R 13/2414 |
| 2019/0089187 A1* | 3/2019 | Konomi | H01F 38/14 |
| 2019/0239004 A1* | 8/2019 | Mueller | H02J 7/0044 |

FOREIGN PATENT DOCUMENTS

| | | |
|---|---|---|
| CN | 111131956 | 5/2020 |
| DE | 29718104 | 1/1998 |
| EP | 1246506 | 10/2002 |
| EP | 1921894 | 5/2008 |
| GB | 2569536 | 6/2019 |
| JP | H09103000 | 4/1997 |
| WO | WO 2018/119176 | 6/2018 |
| WO | WO 2019/091571 | 5/2019 |

OTHER PUBLICATIONS

European search report dated Sep. 2, 2021 for European patent application No. 21159877.6.
Technical examination report dated Aug. 31, 2021 for Danish patent application No. PA 2021 70091.
PCT International Search Report and Written Opinion for International Appln. No. PCT/EP2020/084088 dated Feb. 16, 2021.

\* cited by examiner

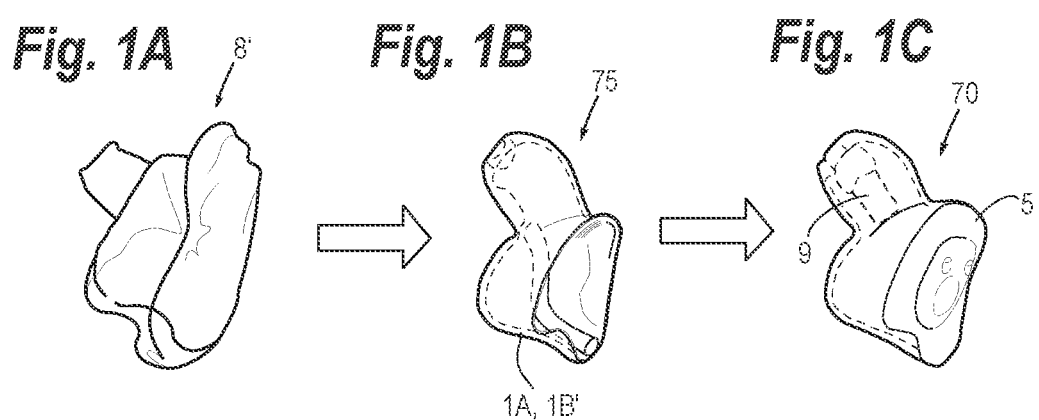

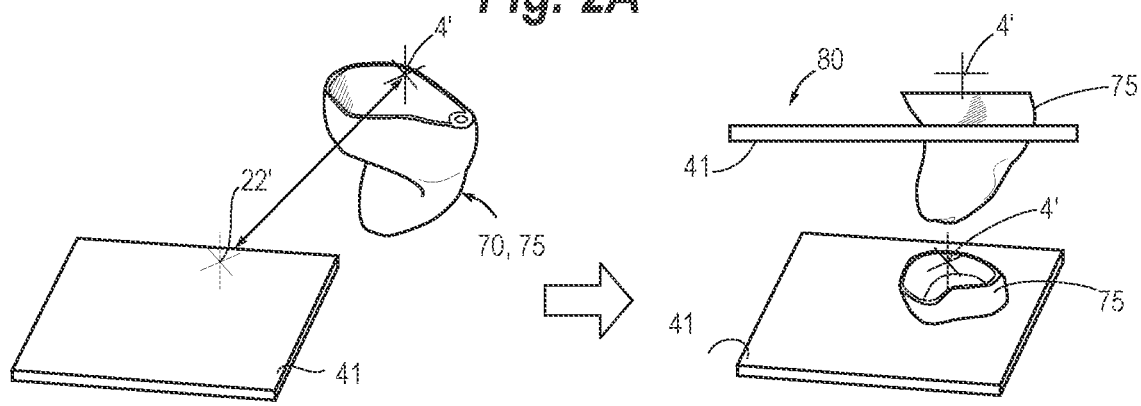
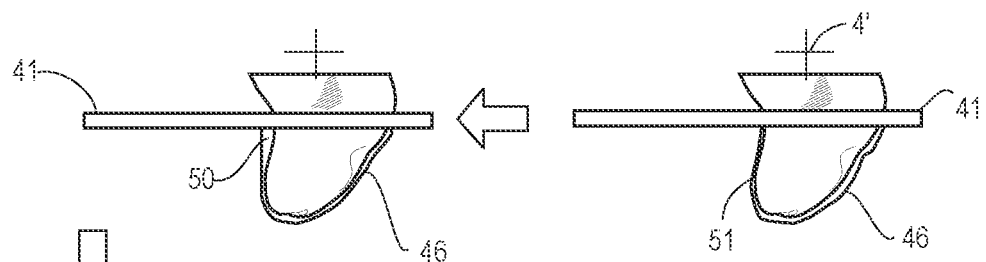
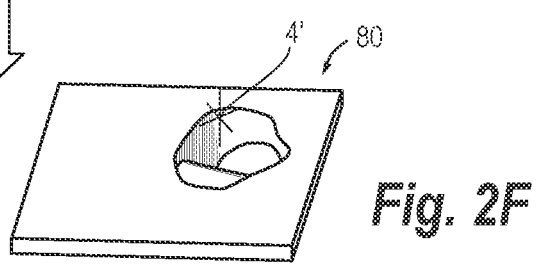

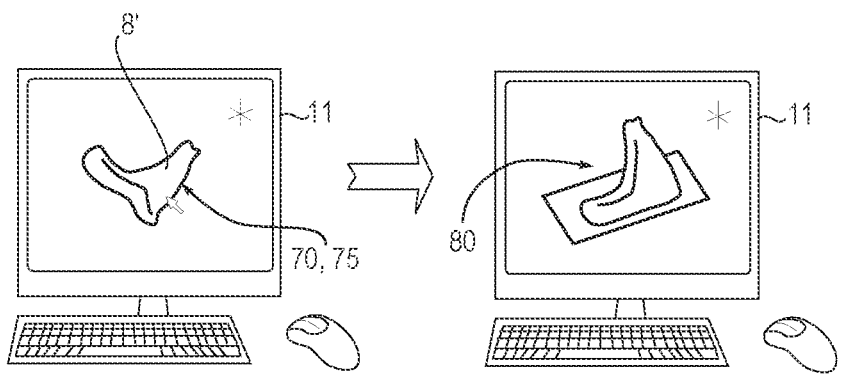
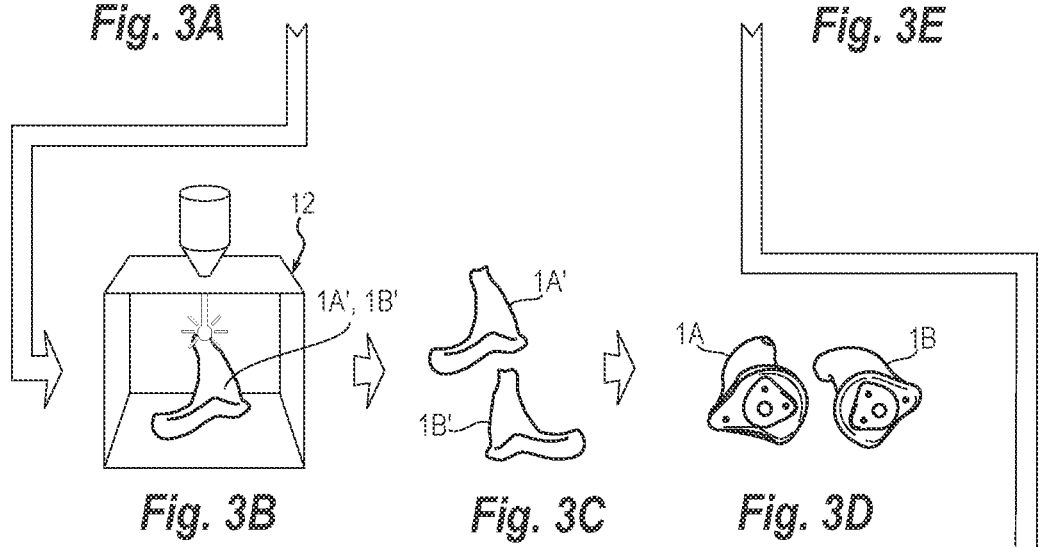
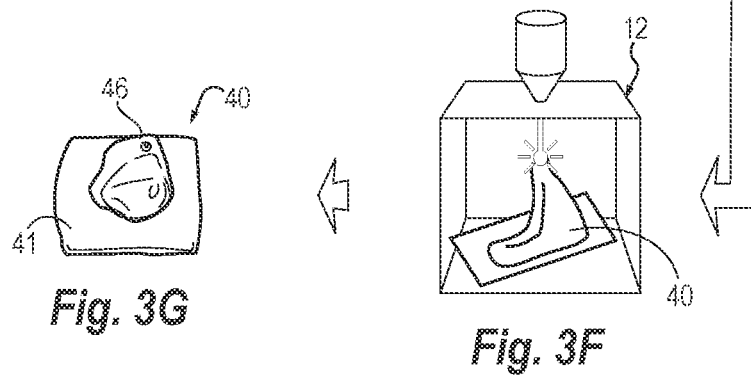
*Fig. 3A*     *Fig. 3E*
*Fig. 3B*    *Fig. 3C*    *Fig. 3D*
*Fig. 3G*     *Fig. 3F*

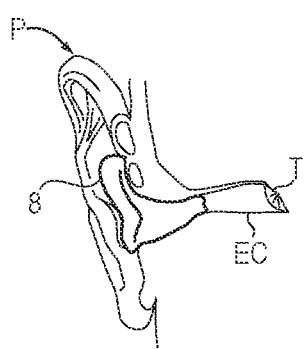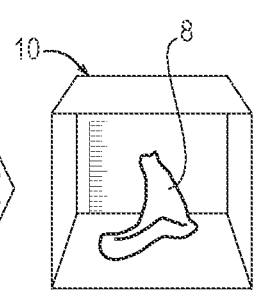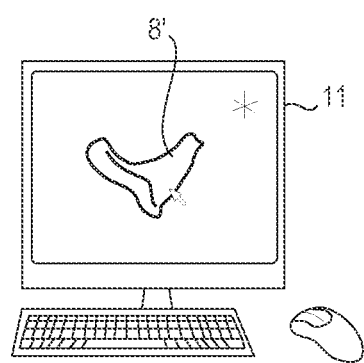
*Fig. 4A*  *Fig. 4B*  *Fig. 4C*

HEARING INSTRUMENT CHARGER DEVICE AND SYSTEM, AND A METHOD OF MANUFACTURING A HOLDER THEREFOR

The present disclosure relates to a method of manufacturing a charger insert part comprising a holder for holding a rechargeable hearing instrument, which is individually customized for at least partly being inserted into an ear canal of a user, in a hearing instrument charger device configured for charging the rechargeable hearing instrument. The present disclosure further relates to a charger insert part, a hearing instrument charger device and a hearing instrument charger system comprising a hearing instrument and a hearing instrument charger device.

BACKGROUND

Rechargeable in-the-ear hearing aids are known in the art. In order to recharge such hearing aids, a hearing aid user is equipped with a charging device. The charging device and the hearing aid may each comprise a cooperating galvanic contact means, or they may comprise cooperating charger coils, such that the hearing aid may be charged "wirelessly", thereby avoiding that the in-the-ear hearing aid needs to be equipped with a galvanic contact. In any case, such charging devices may have a holder for inserting and holding the hearing aids in a fixed position in the charging device during charging.

It is a problem with these devices that the cooperating charger elements may not always be correctly positioned in a first relation with with each other, whereby the charging process may be interrupted or slowed down.

Therefore, it is an object to provide a more stable charging of a hearing instrument, such as a hearing aid.

It is a further object to manufacture a charger insert part comprising a holder for a customized hearing instrument, the charger insert part being insertable in a generic hearing instrument charger device for a custom RHI (Rechargeable Hearing Instrument), which is low-cost, fast and simple to manufacture without post treatment and which fulfills biocompatibility and medical grade requirements.

US 2019/0089187 A1 discloses a standardized hearing aid with a hearing aid charger device.

SUMMARY

In a first aspect, the objects are obtained by a method of manufacturing a charger insert part comprising a holder or holding a rechargeable hearing instrument, which is individually customized for at least partly being inserted into an ear canal of a user, in a hearing instrument charger device configured for charging the rechargeable hearing instrument, the hearing instrument charger device comprising a charger casing having a receiving portion for the charger insert part with a holder, and a first charger element having a first position in the charger casing, the method comprising providing, based on a dataset representing a shape of a portion of an ear canal of the user, a first virtual model of the rechargeable hearing instrument shaped to at least partly conform to the shape of the ear canal portion, including allocating a second position in the first virtual model of the rechargeable hearing instrument for an electronic hearing aid component comprising at least a second charger element;

providing, based on the first virtual model, a second virtual model of a charger insert part for insertion in the receiving portion of the hearing instrument charger device, in which second virtual model the charger insert part is designed to support the rechargeable hearing instrument, such that the first charger element is positioned in a first relation with the second charger element, when the charger insert part is placed in the receiving portion of the hearing instrument charger device; and shaping, by a 3D manufacturing process, the customized charger insert part with the holder based on the second virtual model.

By 3D manufacturing process is meant any process that—based on a dataset of a virtual model (such as the second virtual model mentioned above) of an object to be manufactured, may be shaped to form the 3-dimensional object starting either from a blank and removing material from the blank or by adding material continuously to create the object. Such processes may be milling and stereolithographic process, such as 3D printing, respectively.

In one embodiment, the 3D manufacturing process may be a Rapid Prototyping (RPT) process.

In an embodiment, providing a second virtual model of a charger insert part is further based on data regarding a shape of the charger casing. The shape may further include data regarding the dimensions (size) of the charger casing.

In a further embodiment, providing a second virtual model of a charger insert part, may alternatively or additionally further be based on data regarding the first position of the first charger coil within the charger casing.

In a further embodiment, in addition to any of the previously mentioned embodiments, providing a second virtual model of a charger insert part may comprise allocating the holder in a predetermined orientation relative to the charger casing.

Hereby, is meant the spatial orientation with respect to other portions of the casing, such as side walls, a bottom and/or a lid of the casing of the hearing instrument charger device. The casing and other components, such as electronic components of the hearing instrument charger device, are in some embodiments, a generic casing/hearing instrument charger device, with the exception of the charger insert part comprising a holder for holding the individualized/customized rechargeable hearing instrument, generic in the sense that the casing and/or any electronic components of the hearing instrument charger device may have a standardized shape (e.g. including dimension), such that the charger insert part, when customized to the customized rechargeable hearing instrument is insertable in the charger casing and will fit into the space provided by the charger casing, and such that the first and second charger elements are brought into a interrelationship such that the first charger element may charge the second charger element.

In a further embodiment, in addition to any of the previously mentioned embodiments, positioning the first charger element in a first relation with the second charger element may comprises aligning the first charger element in the charger casing with the second charger element in the rechargeable hearing instrument, when the charger insert part is placed in the receiving portion of the hearing instrument charger device, and when the rechargeable hearing instrument is placed in the charger insert part.

In a further embodiment, in addition to any of the previously mentioned embodiments, providing the second virtual model comprises designing the holder, with at least a subset of surface portions mirroring corresponding surface portions of the customized rechargeable hearing instrument.

Preferably, such a subset of surface portions are chosen such that the customized rechargeable hearing instrument is stably support in holder of the charger insert. Not all surface portions of the customized rechargeable hearing instrument need to be mirrored.

In a further embodiment, in addition to any of the previously mentioned embodiments, providing the second virtual model of comprises removing undercut surfaces of the holder in the second virtual model.

Thereby, it may be secured that in the customized rechargeable hearing instrument may be inserted into and removed from the holder of the charger insert part without damaging the charger insert part and/or the customized rechargeable hearing instrument, especially in cases where the charger insert part is manufactured in a rigid or semi-rigid material.

In a further embodiment, in addition to any of the previously mentioned embodiments, providing a second virtual model of a charger insert part comprises designing the second virtual model of a charger insert part digitally on a computer.

In a further embodiment, in addition to any of the previously mentioned embodiments, providing a first virtual model of the rechargeable hearing instrument may comprise designing the first virtual model of the rechargeable hearing instrument digitally on a computer.

In a further embodiment, in addition to any of the previously mentioned embodiments, the second charger element of the rechargeable hearing instrument is formed in an externally facing face plate of the rechargeable hearing instrument having a planar outer surface, and wherein the method comprises designing the holder of the charger insert such that the planar surface of the externally facing face plate of the rechargeable hearing instrument is substantially parallel to an upwardly facing surface of the charger insert, when the rechargeable hearing instrument is held in the holder.

By "substantially parallel" is meant parallel or within +/−5 degrees from being parallel.

In a further embodiment, in addition to any of the previously mentioned embodiments, the position of the first charger element is in a fixed, standardized position in the charger casing. The casing and other components, such as electronic components of the hearing instrument charger device, are in some embodiments a generic casing/hearing instrument charger device, with the exception of the charger insert part comprising a holder for holding the individualized/customized rechargeable hearing instrument. The hearing instrument charger device/charger casing/is meant to be generic in the sense that the casing and/or any electronic components of the hearing instrument charger device may have a standardized shape (e.g. including dimension), such that the charger insert part, when customized to the customized rechargeable hearing instrument is insertable in the charger casing and will fit into the space provided by the charger casing, and such that the first and second charger elements are brought into a interrelationship such that the first charger element may charge the second charger element. Thus, in a further embodiment, in addition to any of the previously mentioned embodiments the charger casing may also have a fixed, standardized shape and size.

In a further embodiment, in addition to any of the previously mentioned embodiments, the charger casing may comprise a box-shaped charger base and a charger lid configured for covering the charger base. In a further embodiment hereof, the first charger element is positioned in the charger lid. In the latter case, providing the second virtual model may comprise positioning the holder for the second charger element relative to the casing such that when the rechargeable hearing instrument is placed in the holder of the charger insert part, the second charger element is positioned in a first relation with the first charger element, e.g. such that the second charger element is aligned with the first charger element in the lid (and the lid is closed to cover the box-shaped charger base).

In a further embodiment, in addition to any of the previously mentioned embodiments, the first charger element is a first charger coil and the second charger element is second charger coil. Alternatively, the first and second charger elements are galvanic contact elements. In this case the first relation between first charger element and the second charger element, comprises bring the galvanic into contact with each other.

In a further embodiment, in addition to any of the previously mentioned embodiments, the charger insert part comprising the holder is formed from a block of material by milling away material from the block of material. Alternatively, instead of milling, in addition to any of the previously mentioned embodiments, the charger insert part with the holder is formed by in an additive manufacturing process, e.g. a stereolithographic process.

Thus, the charger insert part with the holder may be formed by a 3D printing process.

In a further embodiment, in addition to any of the previously mentioned embodiments, the charger insert part may comprise a plate portion and a holder portion.

The holder portion forms the holder, which may be considered to be a cavity in the holder portion.

The holder portion may preferably be formed integrally with the plate portion. Alternatively, the plate portion and the holder portion are formed separately, and assembled subsequently.

The plate portion may comprise a rim which is shaped to cooperate with i.e. be received in the receiving portion of the charger casing. Preferably, the receiving portion of the charger casing is formed in the box-shaped charger base.

In any case, preferably, the holder portion extends from the plate portion, i.e. from one surface thereof.

In a further embodiment, in addition to the previously mentioned embodiment of forming the holder by a stereolithographic process, the charger insert part is formed such that the plate portion is formed before the holder portion.

Thereby, it is achieved that the charger insert part may be formed without any supports, since the plate portion will provide support throughout the stereolithographic process.

In a further embodiment, in addition to any of the previously mentioned embodiments, the charger insert part comprising the holder is formed in a biocompatible material.

In a further embodiment, in addition to any of the previously mentioned embodiments, the method may comprise an initial step of determining a shape of a portion of an ear canal of the user comprising inserting a portion of a pliable material into the ear canal of the user, thereby forming an ear canal impression, and
  scanning the ear canal impression and providing a dataset representing the shape of a portion of an ear canal of the specific user based on the scanned shape of the ear canal impression for providing the first virtual model.

The providing of a dataset representing the shape of a portion of an ear canal of the user may be obtained from the scan digitally on a computer.

The ear canal impression may be made by pouring a pliable material, such as a casting material, typically a biocompatible, silicone-based material, into the ear canal of the user, who needs or wishes to purchase a customized/personalized/individualized hearing instrument. The casting material may be a two-component liquid material comprising a filler and a curing agent. The casting material will cure within a few minutes after mixture of the two components.

Also, light curing of the casting material is known in the art, using silicone-based materials suitable for light curing.

Such silicone materials of both types are known in the art. Products typically used for this purpose are manufactured by the company Egger (egger Otoplastik+Labortechnik GmbH) or Dreve GmbH.

As an alternative to obtaining a dataset representing the shape of a portion of an ear canal, in a further embodiment, in addition to any of the previously mentioned embodiments, the method may further comprise an initial step of determining a shape of a portion of an ear canal of the user comprising scanning at least a portion of the ear canal of the user; and
providing a dataset representing the scanned shape of the portion of the ear canal of the user from the scan of the portion of the ear canal of the user for providing the first virtual model.

The providing of a dataset representing the shape of a portion of an ear canal of the user may be obtained from the scan digitally on a computer.

The scanning of at least a portion of the ear canal of the user may be carried out optically scanning the portion of the ear canal of the user.

In a second aspect, the objects are achieved by a charger insert part comprising a holder for holding a rechargeable hearing instrument, which is individually customized for at least partly being inserted into an ear canal of a user, in a hearing instrument charger device configured for charging the rechargeable hearing instrument, where the charger insert part is formed by the method according to any one of the above described embodiments of the first aspect.

In a third aspect, the objects are achieved by a hearing instrument charger device for charging a rechargeable hearing instrument, which is individually customized for at least partly being inserted into an ear canal of a user, the hearing instrument charger device comprising a charger insert part comprising a holder for holding the rechargeable hearing instrument during charging, where the charger insert part is formed by the method described n connection with any one of the embodiments of the first aspect mentioned above.

The hearing instrument charger device for charging an individually shaped hearing instrument comprising a second charger element may comprise a charger casing;
a charger power supply arranged within the charger casing;
a first charger coil connected to the charger power supply, charger electronics for controlling charging of the hearing instrument; and
a holder configured for receiving the rechargeable hearing instrument arranged within the charger casing, wherein the holder for the hearing instrument is shaped such that the holder supports the shape of the hearing instrument, and such that the first charger element is adjacent to the second charger element, when the hearing instrument is received in the holder.

In an embodiment, the holder for the rechargeable hearing instrument is provided in a charger insert part.

The charger insert part may thereby be modelled/planned/designed for the custom-made, rechargeable hearing instrument to be inserted into a generic/standard hearing instrument charger device.

In an embodiment, the charger insert part may be formed by a 3D manufacturing process.

In an embodiment, the charger insert part is as a flat structure having an upper surface, a lower surface, and a peripheral rim, where the holder extends away from the lower surface, and where the peripheral rim is configured for cooperating with a rim of the charger casing.

In an embodiment, the hearing instrument charger device comprises a charger lid arranged to cooperate with the charger casing, and the first charger element is arranged in the charger lid in such a way that the first charger element is in an operative position for providing charging power to the second charger element, when the hearing instrument is placed in the holder and the charger lid is closed.

Thereby, it may be achieved that the charging can only occur when the lid is closed, whereby the risk that the hearing instrument accidentally falls out of the hearing instrument charger device is reduced.

In a fourth aspect, the objects are achieved by a hearing instrument system comprising a chargeable hearing instrument; and
a hearing instrument charger device according to any one of the embodiments of the third aspect.

In an embodiment, the hearing instrument charger device comprises a charger lid arranged to cooperate with the charger casing, wherein the first charger element is arranged in the charger lid, and wherein the hearing instrument comprises a second charger element formed in an externally facing faceplate of the hearing instrument and where the first charger element and the second charger element are arranged such that they face each other when the hearing instrument is received in the holder and the lid is closed.

It should be emphasized that the term "comprises/comprising/comprised of", when used in this specification, is taken to specify the presence of stated features, integers, steps or components, but does not preclude the presence or addition of one or more other features, integers, steps, components or groups thereof.

BRIEF DESCRIPTION OF THE DRAWINGS

In the following, the embodiments will be described in greater detail with reference to the enclosed figures. It should be emphasized that the embodiments shown are used for exemplary purposes only and should not be used to limit the scope of the claimed invention.

FIGS. 1A-1-C illustrate steps of providing a first virtual model of a rechargeable hearing instrument, the first virtual model being for use in an embodiment of the method, FIG. 1A illustrates a virtual model or dataset resembling a shape of a portion of an ear canal of a user;

FIG. 1B illustrates a virtual model or dataset of a shape of a shell of a hearing instrument forming a negative corresponding to the shape of the portion of an ear canal of a user based on the virtual model or dataset illustrated in FIG. 1A;

FIG. 1C illustrates a virtual model or dataset of a shape of rechargeable hearing instrument which has a shape being customized to the shape of the ear canal of the user, the virtual model or dataset comprising the location of component of the rechargeable hearing instrument;

FIG. 2A-F illustrate steps of providing a second virtual model of or dataset representing a rechargeable hearing instrument, the second virtual model being for use in an embodiment of the method;

FIG. 2A illustrates a first virtual model or dataset representing a shape of a rechargeable hearing instrument provided as illustrated in FIG. 1A-C or 4A-C;

FIG. 2B illustrates modelling the location of the representation of the rechargeable hearing instrument relative to the position of a representation of the location of a first charging element of the charger device.

FIG. 2C illustrates the representation of the rechargeable hearing instrument in the charger insert part, where the top depiction is a side view and the bottom depiction is a perspective view from above;

FIG. 2D illustrates the representation of the rechargeable hearing instrument in the charger insert part and modelling a holder part of the charger insert part;

FIG. 2E illustrates modelling a revised shape of the holder part of the charger insert part.

FIG. 2F, in a perspective view, shows the completed second virtual model of a charger insert part for use in forming the charger insert part;

FIGS. 3A-D illustrates forming a set of customized rechargeable hearing instruments, and FIGS. 3E-G, an embodiment of the method according to the first aspect;

FIG. 3A illustrates providing a first virtual model of a rechargeable hearing instrument;

FIG. 3B illustrates forming a shell part of the rechargeable hearing instrument for example in a 3D printer;

FIG. 3C shows to finished shell parts customized for the left and right ear canal of a user;

FIG. 3D, shows a set of customized rechargeable hearing instrument, where components, including a second charger element has been mounted in each of the shell parts illustrated in FIG. 3C;

FIG. 3E illustrates providing, based on the first virtual model provided in FIG. 3A, a second virtual model representing a customized charger insert part suitable for the customized rechargeable hearing instruments shown in FIG. 3D;

FIG. 3F illustrates forming a charger insert part based on the second virtual model as illustrated in FIG. 3E, for example in a 3D printer;

FIG. 3G shows a completed customized charger insert part, suitable for the customized rechargeable hearing instruments shown in FIG. 3D, and ready for mounting in a casing of a hearing instrument charger device;

FIGS. 4A-C illustrates one way of obtaining a dataset regarding the shape of a portion of the ear canal of a user for use in the method;

FIG. 4A shows a partial section through an ear and ear canal of a human being and an ear canal impression in a portion of the ear canal;

FIG. 4B shows an ear canal impression located in a 3D-scanner, and illustrates a step of scanning—such as optically scanning—the impression to obtain a dataset resembling the ear canal portion of the user;

FIG. 4C shows a PC with a keyboard, mouse and suitable 3D modelling software, and illustrates how the dataset obtained by scanning may be transferred to a computer with software for providing at least a virtual model/dataset representing the shape of a portion of the ear canal of the user;

DETAILED DESCRIPTION OF THE EMBODIMENTS

Figure 5:
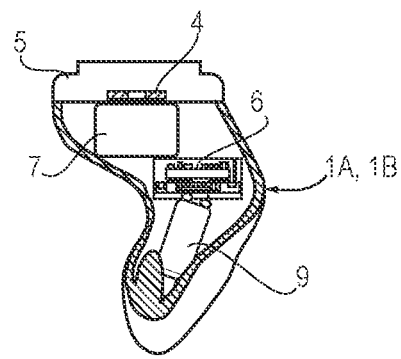
FIG. 5, in a cross-sectional side view, shows a customized, chargeable hearing instrument.

Various embodiments are described hereinafter with reference to the figures. Like reference numerals refer to like elements throughout. Like elements will, thus, not be described in detail with respect to the description of each figure. It should also be noted that the figures are only intended to facilitate the description of the embodiments. They are not intended as an exhaustive description of the claimed invention or as a limitation on the scope of the claimed invention. In addition, an illustrated embodiment needs not have all the aspects or advantages shown. An aspect or an advantage described in conjunction with a particular embodiment is not necessarily limited to that embodiment and can be practiced in any other embodiments even if not so illustrated, or if not so explicitly described.

The present disclosure relates to customized chargeable hearing instruments 1A, 1B, and the manufacture of a hearing instrument charger device 20 for charging such chargeable hearing instruments 1A, 1B, or at least the manufacture of charging insert part 40 for such a hearing instrument charger device 20.

Customized chargeable hearing instruments 1A, 1B vary in shape from user to user and from ear to ear of one user. Therefore, the use of a standardized, one-shape holder in a hearing instrument charger device does not necessarily secure a correct placement of charger elements of the chargeable hearing instruments relative to the charger elements of the hearing instrument charger device. In order to improve the charging efficiency of the charging of the chargeable hearing instruments 1A, 1B, according to some embodiments, a customized charger insert part 40 configured for holding such customized chargeable hearing instruments 1A, 1B in correct position relative to charger elements of a hearing instrument charger device 20 is provided.

Now, with reference to FIG. 5, however, a hearing instrument 1A, 1B will first be described. FIG. 5 shows a section through a hearing instrument 1A, 1B. The hearing instrument 1A, 1B comprises a hearing instrument shell 1, made/formed as mentioned above and described in further detail below.

The hearing instrument 1A, 1B has a proximal end, which, when the hearing instrument 1A, 1B is inserted in the ear canal EC of the user, is closest to the eardrum, i.e. the tympanic membrane T, of the user, and an opposite distal end, which, when the hearing instrument 1A, 1B is inserted (not shown) in the ear canal of the user, is located at the entrance to the ear canal EC of the user. The hearing instrument further comprises a set of internal components arranged inside the hearing instrument shell 1, 1A', 1B'.

These components comprise electrical components such as a speaker, which is commonly referred to as a receiver, hereinafter a hearing instrument receiver 9, a rechargeable battery (or hearing instrument rechargeable battery 7), a second charger element 4, and control electronics; hearing aid electronics 6 for controlling at least the hearing instrument receiver 9 and the charging of the hearing instrument rechargeable battery 7 via the second charger element 4. The second charger element 4 is charged via first charger element 22, 23 provided in a hearing instrument charger device 20 described in the following in connection with FIG. 6.

The hearing instrument receiver 9 is typically arranged in the proximal end of the hearing instrument 1A, 1B in order to be close to the eardrum of the user when inserted into the ear canal EC of the user. The other components may be arranged within the hearing instrument shell 1A', 1B' in positions that may vary dependent on the individual shape of the hearing instrument shell 1A', 1B'.

The hearing instrument 1A, 1B may further comprises a passage from the hearing instrument receiver 9 to the proximal end of the hearing instrument, a filter for preventing earwax and other impurities from entering the hearing instrument 1A, 1B. Further, the internal surface of the internal space of the hearing instrument shell 1A', 1B' may be structured such that the internal components may be installed/mounted in the designed/planned positions.

The internal components may additionally comprise one or more microphones (not shown in FIG. 5). A microphone may for example be provided at the distal end of the hearing instrument.

The internal components may additionally comprise a device for wirelessly communicating with other equipment. For example, such a device may communicate with a behind-the-ear device, a mobile phone/cell phone, or other external electronic devices.

The electronic components located in the internal space of the hearing instrument 1A, 1B may be electronically connected to each other, e.g. by a suitable wiring, to transfer energy and/or data.

The hearing instrument 1A, 1B shown in FIG. 5, at the distal end, is provided with a faceplate 5, for closing the internal space of the hearing instrument 1A, 1B. The faceplate 5 is intended for sealing the internal space with the internal components from impurities from the external environment.

The faceplate 5, may be shaped to fit contours of the ear canal of the user. However, the distal end of the hearing instrument will typically not be in contact with any surfaces of the ear canal of the user but be located at the opening/entrance from the outer ear into the ear canal of the user when inserted in the ear canal. Therefore, the faceplate 5 may be shaped with a regular planar surface, as shown in FIG. 5.

In the hearing instrument 1A, 1B shown in FIG. 5, the second charger element 4 is shown adjacent to the faceplate 5. For example, the second charger element 4 may be integrated in the faceplate 5, or be located adjacent the internal surface of the faceplate 5. In some embodiments the second charger element 4 may be located in a recess formed in the internal surface of the faceplate 5. Alternatively, the charger element 4 may be structurally connected (not shown) to other components in the internal space or to internal walls of the hearing instrument shell 1A', 1B'.

As it is also indicated above, the second charger 4 may, however,—in other embodiments—be located in other positions within the cavity/internal space of the hearing instrument 1A, 1B.

Figure 6:
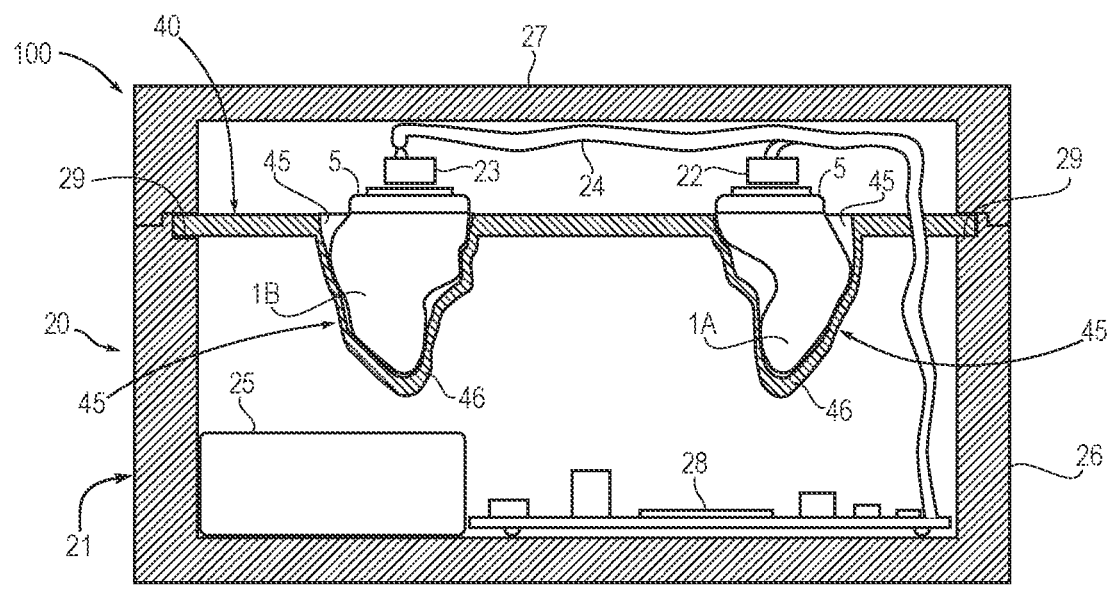
FIG. 6, in a cross-sectional side view, shows a hearing instrument charger device according to a third aspect, with a charger insert part according to the second aspect, the charger insert part being formed in a method according to the first aspect.

FIG. 6 shows a hearing instrument charger device 20, wherein a charger insert part manufactured by the inventive method described further below is inserted.

The hearing instrument charger device 20 comprises charger casing 21. The charger casing 21 in this embodiment comprises a charger base 26 and a charger lid 27. The charger base 26 in this embodiment forms an open box-shaped structure with an internal volume. The internal volume may host a charger power supply 25. In the embodiment shown, the charger power supply 25 is a battery. The battery may be a replaceable battery, either a singly non-chargeable battery or a chargeable battery. Alternatively, the battery could be a fixed chargeable battery. In embodiments, where the charger power supply 25 is a chargeable battery, the hearing instrument charger device 20 may provide a portable power bank for one or more hearing instruments 1A, 1B.

In other embodiments, the charger power supply 25 of the hearing instrument charger device 20 may be a transformer for converting mains power into power for the one or more hearing instruments 1A, 1B. In yet other embodiments, the charger power supply 25 of the hearing instrument charger device 20 may be a transformer connected to a rechargeable battery, such that the hearing instrument charger device 20 may charge one or more hearing instruments 1A, 1B both when connected to the mains (via a not shown cable) and when disconnected from the mains.

The internal volume of the charger casing 21 of the hearing instrument charger device 20 may further host charger electronics 28 for controlling charging of the charger power supply 25 (when it's a fixed rechargeable battery) and/or the one or more hearing instruments 1A, 1B.

The hearing instrument charger device 20 further comprises first charger elements 22, 23, one for each hearing instrument 1A, 1B to be charged.

The charger electronics 28 is connected to the charger power supply 25 via suitable wiring (not shown). Further, the charger electronics 28 is connected to the first charger coils 22, 23 via suitable wiring, such as a cable 24.

The charger electronics 28 preferably is configured such that it may detect the presence of a hearing instrument 1A, 1B in the vicinity thereof and start charging if a hearing aid is present. This may be accomplished if presence of a first charger element 4 of a hearing instrument 1A, 1B is detected.

The charger insert part 40 may, as shown in FIG. 6, cover the internal volume of the charger base 26 of the charger casing 21, the charger insert part 40 being arranged in a receiving portion 29 of the charger casing 21. As shown in FIG. 5, it will be appreciated that the receiving portion 29 may be a rim of the box shaped charger base 26. The receiving portion 29 in the form of the rim of the box shaped charger base 26 is preferably sized ad shaped to receive the charger insert part 40. For example a peripheral rim of a plate portion 41 of the charger insert part 40 may be sized and shaped to be received by the rim of the of the box shaped charger base of the casing 21.

In FIG. 6 the charger insert part 40 is illustrated with two holders 45, each holder 45 for holding a chargeable hearing instrument 1A, 1B. Such a charger insert part may be manufactured according to the method described below. It will be appreciated however, that the charger insert part 40 may be formed with only a single holder 45 for holding a single chargeable hearing instrument 1A, 1B. In such case the charger casing 21 may have a receiving portion 29 for each of a number of charger insert parts 40, one for each customized chargeable hearing instrument 1A, 1B to be charged. Typically, this means two charger insert parts 40, one for each chargeable hearing instrument 1A, 1B, since most users need one chargeable hearing instrument 1A, 1B for each ear.

The position of the one or more holders 45 relative to the charger insert part 20 is configured—during the modelling face—such that—when the charger insert part 40 is inserted in the charger casing 21, and when hearing instruments 1A, 1B are inserted into the holders 45—the second charger element 4 (in each hearing instrument 1A, 1B, not shown in FIG. 6) is aligned with the respective ones of the first charger elements 22, 23.

A precise alignment of the first charger element 4 with the second charger element 22, 24 is also assured by the shape of the holders 45 only allowing the respective hearing instrument 1A, 1B to be inserted in one specific orientation.

The first charger element 22, 23 may, in one embodiment, and as shown in FIG. 6, be provided connected to the charger lid 27. Such a configuration of the hearing instrument charger device 20 may ensure that the charging is only started when the lid is closed, and the first charger element 22, 24 thereby have been brought into alignment with the second charger element 4 in the corresponding hearing instrument 1A, 1B.

In the embodiment shown in FIG. 6, the holders 45 and the charger insert part 40 are configured such that the hearing instruments 1A, 1B (when inserted in the holders 45) are positioned upright with the proximal end/faceplate 5, facing upward and a plane defined by the surface of the faceplate 5 being parallel with a plane defined by the upper surface of the charger insert part 40. In this case the first charger element in the hearing instrument 1A, 1B is arranged in the faceplates 5A, 5B as shown in FIG. 5.

It will however be appreciated that in alternative embodiments, the holder 45 and the charger insert part 40 may be configured such that the hearing instrument 1A, 1B is oriented differently relative to the plane defined by the upper surface of the charger insert part 40 than shown in FIG. 6. For example, the hearing instrument 1A, 1B could be "laying down" rather than the upright position shown in FIG. 6. In such cases the second charger element 4 in the hearing instrument 1A, 1B could be arranged parallel to a sidewall portion of the hearing instrument shells 1A', 1B', rather than in the faceplate 5 as shown in FIGS. 5 and 6.

It will also be appreciated that in yet other embodiments, the first charger element 22, 23 may be arranged inside the charger base 26 of the charger casing 21 rather than in the charger lid 27, in which case the holder 45, the charger insert part 40 and/or the hearing instrument 1A, 1B (the positioning or the first charger element 4 in the hearing instrument 1A, 1B) is modelled and formed such that when the hearing instrument 1A, 1B is placed in the holder 45 the first and second charger elements are aligned with each other.

Markings may be formed on the charger insert part 40 next to the respective holder 45, the markings indicating which hearing instrument to insert in which holder 45'. The markings may e.g. be an "L" for "left" and "R" for "right" to indicate the place to insert and recharge the left and right hearing instruments 1A, 1B, respectively. Other symbols or text may be considered alternatively. The markings may be formed as impressions in the charger insert part 40. In other embodiments the markings may be provided on the charger insert part 40 after it has been shaped with the holder/holders, e.g. by stamping, printing or other technique known in the art.

A corresponding marking, indicating the relation between the holder 45 and the corresponding hearing instrument 1A, 1B, may be designed at the modeling stage such that the hearing instruments 1A, 1B are formed with a marking in an outer surface.

FIG. 6 also illustrates a hearing instrument system 100 comprising a set of hearing instruments 1A, 1B, and a hearing instrument charger device 20.

A first aspect the present disclosure concerns a method of manufacturing a charger insert part 40 comprising a holder 45 for holding a rechargeable hearing instrument 1A, 1B for example as described above. As also mentioned, the rechargeable hearing instrument 1A, 1B is individually customized for at least partly being inserted into an ear canal of a user. The insert part 40 comprising a holder 45 is configured for holding the rechargeable hearing instrument 1A, 1B in a hearing instrument charger device 20, and the hearing instrument charger device 20 is configured for charging the rechargeable hearing instrument 1A, 1B.

The hearing instrument charger device 20 may be as described above in connection with FIG. 6, however, more generally the hearing instrument charger device 20 may comprise a charger casing 21 having a receiving portion 29 for the charger insert part 40 comprising a holder 45, and a first charger element 22, 23. The first charger element 22, 23 has a first position in the charger casing 21.

The method according to some embodiments comprises
providing, based on a dataset 8' representing a shape of a portion of an ear canal of the user, a first virtual model 70 of the rechargeable hearing instrument 1A, 1B shaped to at least partly conform to the shape of the ear canal portion, including allocating a second position in the first virtual model of the rechargeable hearing instrument 1A, 1B for an electronic hearing aid component 28 comprising at least a second charger element 4;
providing, based on the first virtual model, a second virtual model 70 of a charger insert part 40 for insertion in the receiving portion 29 of the hearing instrument charger device 20, in which second virtual model 80 the charger insert part 40 is designed to support the rechargeable hearing instrument 1A, 1B, such that the first charger element 22, 23 is positioned in a first relation with the second charger element 4, when the charger insert part 40 is placed in the receiving portion 29 of the hearing instrument charger device 20; and
shaping, by a 3D manufacturing process, the customized charger insert part with the holder 45 based on the second virtual model 80.

FIGS. 1A-C illustrate steps of providing a first virtual model 70 of a rechargeable hearing instrument 1A, 1B, the first virtual model 70 being for use in an embodiment of the method.

FIG. 1A illustrates a virtual model 8' or dataset resembling a shape of a portion of an ear canal EC of a user. Such a virtual model 8' may be obtained by scanning the ear canal EC of the user, or by making and impression 8 of the desired portion of the ear canal and scanning the impression. This will be described in a little more detail further below.

The dataset 8' resembling/representing a shape of a portion of an ear canal EC of a user is used to provide a representation of the shape of a shell 1A', 1B' of a hearing instrument 1A, 1B. This is illustrated in FIG. 1B. FIG. 1B illustrates a virtual model or dataset of a shape of a shell 1A', 1B' of a chargeable hearing instrument 1A, 1B forming a negative corresponding to the shape of the portion of an ear canal EC of a user, based on the virtual model 8' or dataset illustrated in FIG. 1A.

Any or all of these steps are preferably made in a computer using suitable modelling software. Thus, it will be appreciated that in the method according some embodiments, providing a first virtual model of the rechargeable hearing instrument 1A, 1B may comprise designing the first virtual model 70, 75 of the rechargeable hearing instrument 1A, 1B digitally on a computer.

The virtual model 75 or dataset of a shape of a shell 1A', 1B' of a chargeable hearing instrument 1A, 1B is then used to provide a representation of the shape of a chargeable hearing instrument 1A, 1B for example as illustrated in FIG. 1C. FIG. 1C illustrates a second virtual model 80 or dataset representing a shape of a rechargeable hearing instrument 1A, 1B, which has a shape being customized to the shape of the ear canal EC of the user. Providing the second first model 70 or dataset comprises determining or allocating the location of component 4, 5, 6, 7, 9 of the rechargeable hearing instrument 1A, 1B, such as at least a second charger element 4, but also other hearing instrument electronics 6, a rechargeable cell 7 and a receiver 9. In the embodiment shown the first virtual model 70 also is shown to incorporate a location or a face plate 5, for example as described above.

Thus, it will be appreciated that in the method according to some embodiments, the second charger element 4 of the rechargeable hearing instrument 1A, 1B may is designed to be located in an externally facing face plate 5 of the rechargeable hearing instrument 1A, 1B having a planar outer surface, and wherein the method may further comprise designing the holder 45 of the charger insert 40 such that the planar surface of the externally facing face plate 5 of the rechargeable hearing instrument 1A, 1B is substantially parallel to an upwardly facing surface of the charger insert 40, when the rechargeable hearing instrument 1A, 1B is held in the holder 45.

It will be appreciated that in the process of designing or modelling the second virtual model 80 for the rechargeable hearing instrument 1A, 1B allocating space and location/position for the components thereof, and in particular the second charger element 4 may comprise using date regarding the intended location of a first charger element 22, 23 within the casing of the hearing instrument charger device 20.

Preferably, at least the charger casing 21 may be a standardized casing. Thereby, the components of the hearing instrument charger device 20 and the layout of the rechargeable hearing instrument(s) 1A, 1B may customized relative to a known configuration of the charger casing 21. In some embodiments at least the position of the first charger element 22, 23 is in a fixed, standardized position in the charger casing 21. In yet other embodiment all of the components of the hearing instrument charger device 20 are standardized. Thereby, the only part to be individualized is the charger insert part 40 comprising the holder 45.

In some embodiments, the method entails designing the charger insert part 40 to comply with the charger casing 21 comprising a box-shaped charger base 26 and a charger lid 27 configured for covering the charger base 26, and where the first charger element 22, 23 is positioned in the charger lid 27.

In any embodiment the charger element 22, 23 is a first charger coil and the second charger element 4 is second charger coil. In this case aligning the first and second charger elements means to align the axes of the coils.

Turning now to FIGS. 2A-F, these figures illustrates steps of providing a second virtual model 80 of or dataset representing a rechargeable hearing instrument 1A, 1B, the second virtual model 80 being used in an embodiment of the method.

FIG. 2A illustrates a first virtual model 70 or dataset representing a shape of a rechargeable hearing instrument 1A, 1B provided as illustrated in connection of FIG. 1A-C or 4A-C. The first virtual model 70 comprises at least the above mention virtual model 75 or dataset representing a shape of a shell 1A', 1B' of a chargeable hearing instrument 1A, 1B, and a second charger element position 4' within the first virtual model 70 of a second charger element 4, as well as the planned position of the first charger element 22, 23, a first charger element position 22' as illustrated in FIG. 2B.

FIG. 2B illustrates modelling the location of the representation 70, 75 of the rechargeable hearing instrument 1A, 1B, relative to the first charger element position 22", i.e. a representation of the location of a first charging element 22, 23 in the casing 21 of the hearing instrument charger device 20.

The FIG. 2C illustrates the representation, first virtual model 70, of the rechargeable hearing instrument 1A, 1B in the charger insert part 40. In FIG. 2C, the top depiction is a side view, and the bottom depiction is a perspective view from above of the representation of the rechargeable hearing instrument 1A, 1B in the charger insert part 40.

The placement of the shape representing the hearing instrument shell 1A', 1B' in the charger insert part, may comprise orienting the rotating the representation 75 of the hearing instrument shell 1A', 1B' or the representation 70 of the rechargeable hearing instrument 1A, 1B relative to the known positions of walls of the casing and electronic component in the casing 21 of the hearing instrument charger device 20. This positioning may for example comprise rotation of the rotating the representation 75 of the hearing instrument shell 1A', 1B' or the representation 70 of the rechargeable hearing instrument 1A, 1B relative to known or desired positions of all elements of the hearing instrument charger device 20.

When, as illustrated in FIG. 2B, the representation 75 of the hearing instrument shell 1A', 1B' or the representation 70 of the rechargeable hearing instrument 1A, 1B has been positioned in the charger insert part 40, the holder 45 may be modelled as illustrated in FIG. 2D. FIG. 2D illustrates the representation 70 of the rechargeable hearing instrument in the charger insert part and modelling a holder portion 46 of the charger insert part 40. This part of the modelling entails make cavity surfaces, and offsetting the surfaces holder portion 46 to allow room for the rechargeable hearing instrument 1A, 1B in the finished charger insert part holder 45.

Thus, it will be appreciated that in the method according to some embodiments, providing a second virtual model of a charger insert part 40 may further be based on data regarding a shape of the charger casing. As mentioned above, such data may comprise information on the size and shape of the charger casing, and the modelled positions of components therein, such as described in connection with FIG. 6 above.

Thus, it will be appreciated that in the method according to some embodiments, providing a second virtual model of a charger insert part 40 may further based on data regarding the first position of the first charger coil 22, 23 within the charger casing 21.

It will further be appreciated that in the method according to some embodiments, providing a second virtual model of a charger insert part 40 comprises allocating the holder 45 in a predetermined orientation relative to the charger casing 21

It will further be appreciated that in the method according to some embodiments, positioning the first charger element 22, 23 in a first relation with the second charger element 4 comprises aligning the first charger element 22, 23 in the charger casing 21 with the second charger element 4 in the rechargeable hearing instrument 1A, 1B, when the charger insert part 40 is placed in the receiving portion 29 of the hearing instrument charger device 20, and when the rechargeable hearing instrument 1A, 1B is placed in the charger insert part 40.

FIG. 2E illustrates modelling a revised shape of the holder part 46 of the charger insert part. This may entail removing undercut volumes/surfaces from the virtual model. FIG. 2F, in a perspective view, shows the completed second virtual model 80 of a charger insert part 40 for use in forming the charger insert part 40.

Thus, it will be appreciated that in the method according to some embodiments, providing the second virtual model may comprise designing the holder 45, with at least a subset of surface portions identical to corresponding surface portions of the rechargeable hearing instrument 1A, 1B.

It will further be appreciated that in the method according to some embodiments, providing the second virtual model 80 may comprise removing undercut surfaces of the holder 45 in the second virtual model 80.

Any or all of these steps are preferably made in a computer 11 using suitable modelling software. Thus, it will be appreciated that in the method according to some embodiments, providing a second virtual model of a charger insert part 40 may comprise designing the second virtual model of a charger insert part digitally on a computer.

Once the second virtual model 80 of the customized charger insert part 40 with the holder 45 has been provided as described above, the second virtual model 80 may be used to form or shape the charger insert part 40, such as by a 3D manufacturing process, as discussed briefly above, and as illustrated in FIGS. 3E-F.

FIG. 3E illustrates providing, based on the first virtual model 70 provided as illustrated in FIG. 3A or in FIGS. 2A-F above, a second virtual model 80 representing a customized charger insert part 40 suitable for the customized rechargeable hearing instruments 1A, 1D, for example shown in FIG. 3D. FIGS. 3D (and 3A-C) will be discussed in further detail below.

Retuning now to FIG. 3F, this figure illustrates forming a charger insert part based on the second virtual model as illustrated in FIG. 3E, for example in a 3D printer 12.

FIG. 3G shows a completed customized charger insert part 40 suitable for the customized rechargeable hearing instruments 1A, 1B shown in e.g. FIG. 3D, and ready for mounting in a casing 21 of a hearing instrument charger device 20.

Returning now to FIGS. 3A-D, these figures illustrates forming a set of customized rechargeable hearing instruments 1A, 1B FIG. 3A illustrates providing a first virtual model 70 e.g. as described above in connection with FIGS. 1A-C, of a rechargeable hearing instrument 1A, 1B.

FIG. 3B illustrates forming a shell part 1A', 1B' of the rechargeable hearing instrument 1A, 1B for example in a 3D printer 12. It will be appreciated that other ways of forming the hearing instrument shells 1A', 1B' may be used alternatively.

FIG. 3C shows to finished hearing instrument shell parts 1A', 1A' customized for the left and right ear canal of a user respectively.

Once the hearing instrument shell parts 1A', 1B' have been provided, the various components, such as those described above in connection with FIG. 5 may be mounted into the hearing instrument shell parts 1A', 1B'. FIG. 3D, shows a set of customized rechargeable hearing instrument, where there components, including a second charger element 4 has been mounted in each of the hearing instrument shell parts 1A', 1B' illustrated in FIG. 3C;

FIG. 4A, in a partially sectional view, shows an ear and ear canal EC of a (future) user of a hearing instrument, such as a hearing aid, and an ear canal impression 8 in a portion of the ear canal. In the figure, the reference P is the pinna of the user's ear. EC is the ear canal, which is shown in section, and T points to the tympanic membrane of the user's ear. The ear canal impression 8 is shown located inside the ear canal EC in a location like where a hearing device, such as hearing aid, would be located during use of such a device.

The ear canal impression 8 may be used in a known process to manufacture an individualized hearing instrument 1A, 1B.

The hearing instrument 1A, 1B may for example be a prescription hearing aid for people with a diagnosed hearing loss, but the charging device may also be used in relation to the charging of other types of hearing instruments configured for being located in the ear canal of a user during use.

Today, hearing aid shells for customized hearing aids are made from digital 3D-scans of a cast of the ear canal, i.e. an ear canal impression 8 as shown in FIG. 4A.

FIG. 4A shows one ear and ear canal EC of a user, in this case the right ear and ear canal EC. It is clear that the user may also have a left ear and a left ear canal. In FIG. 4A, an ear canal impression 8 of the right ear canal EC is shown in position in the right ear canal EC. A person skilled in the art will realize that a similar impression may be made of the opposite ear canal of the user.

The ear canal impression 8 is made by pouring a casting material, typically a biocompatible, silicone-based material, into the ear canal of the user, who needs or wishes to purchase a customized/personalized/individualized hearing instrument.

While the biocompatible, silicone-based material at least partially cures inside the ear canal of the user, the ear canal impression 8 will thereby be formed into a shape conforming to the shape of the ear canal EC. Typically, the biocompatible silicone-based material will also be made to cover the tragus of the user, such that the ear canal impression also reflects the shape of the user's tragus. Thereby, a hearing instrument 1A, 1B based on the ear canal impression 8 (see below), can be shaped to match also the tragus of the user, which aids in inserting the hearing instrument 1A, 1B correctly in the ear canal with respect to its rotational orientation.

When the material has cured, the ear canal impression 8 is removed from the ear canal EC of the user, and a digital 3D-scan is made of the ear canal impression 8, as illustrated in FIG. 4B, for use in a modeling stage performed by an operator by help of suitable 3D modelling software on a computer, illustrated in FIG. 4C.

FIG. 4B illustrates 3D scanning of the ear canal impression 8 of the ear canal EC of the ear shown in FIG. 4A. It is clear that instead of or in addition to the impression of the ear canal EC, shown in FIG. 4A, an impression of the opposite ear canal may be provided in the same manner.

In the modelling stage, the shape of the hearing instrument shell 1A', 1B' is determined based of the data from the scanning. Where the ear canal impression 8 is a solid model of the ear canal (or at least a suitable section thereof), the hearing instrument shell 1A', 1B' will be a hollow structure, having an outer surface with a shape conforming to the ear canal of the user, and an internal space for various components of the rechargeable hearing instrument 1A, 1B.

In the modelling stage, the positions of electronic components, for example a speaker (often referred to as a receiver), a rechargeable battery, microphones, etc., needed in the finished device (hearing instrument) are defined (planned) in a 3D data file providing the design/layout for the finished hearing instrument 1A, 1B. Thus, in the modelling stage, the shape of the electronic components and the locations/positions of the electronic components and other parts inside the hearing instrument shell is planned/designed.

The shape of the ear canals of one user may vary widely from those of other people's ear canals, and the two ear canals of one user may also differ in shape. Therefore, the space available for the internal components may vary from one hearing instrument to the next, and therefore the location/position of the internal components inside an individual hearing instrument may also vary.

When the layout of each of the future hearing instruments 1A, 1B has been planned, each hearing instrument shell 1A', 1B' is then manufactured, typically in a 3D-printer, as illustrated in FIG. 3B. The hearing instrument shell 1A', 1B' may be manufactured directly from the design in a 3D data file created in the computer mentioned above, in the modelling stage, as described above.

Each of the hearing instrument shells 1A', 1B' may be manufactured in a biocompatible material, or be post-treated, such that it is suitable for inserting into the ear canal EC of a user under current biocompatibility and medical grade requirements and regulations. The material used may be pliant/resilient to ease the insertion of the finished hearing instrument 1A, 1B into the ear canal EC of the user, and such that the hearing instrument may adapt to e.g. jaw movements during use.

Ear canal impressions 8 are often kept on record for later reproductions and documentation, etc.

FIGS. 4A-C illustrate one way of obtaining individualized information relating to the shape of the ear canal or ear canals of a user, by use of a cast (the ear canal impression) of the ear canal and 3D-scanning the cast. The data/information regarding the shape of the ear canal EC of the user (and in some cases also the shape of the tragus of the user) is transferred to a computer for further processing.

Thus, FIG. 4A illustrates a step A of obtaining an impression of an ear canal EC. FIG. 4B illustrates a step B of digitalizing the shape of the ear canal. FIGS. 4A-B thus also illustrate a combined step determining a shape of at least a portion of an ear canal of a user in a method of manufacturing a holder 40 for holding an individually shaped hearing instrument 1A, 1B in a hearing instrument charger device 20 configured for charging the hearing instrument 1A, 1B.

In principle this shape data/information may be obtained in other ways, e.g. by 3D-scanning the ear canal, such as optically scanning portion of the ear canal of a user.

As mentioned FIG. 3A illustrates how the obtained shape data in a step C is used to design/plan one or more hearing instrument 1A, 1B using a computer 11.

FIGS. 3B-D illustrates three steps of a known process of forming a hearing instrument 1A, 1B, using shape data 8' stored in the computer 11.

FIGS. 3E-G illustrates three steps of an embodiment of a process of forming at least one charger insert 40 comprising a holder 45 for receiving a hearing instrument 1A, 1B in a hearing instrument charger device 30.

In all cases described above, the 3D manufacturing process may instead of the shaping in a 3D printer 12 as illustrated in the figures, entail shaping the charger insert part 40 comprising the holder 45 from a block of material by milling away material from the block of material.

As used in this specification, the term "substantially parallel" refers to two items (e.g., two lines, two surfaces, etc.) forming an angle that is 0 degree+/−10 degrees.

It is to be noted that the figures and the above description have shown the example embodiments in a simple and schematic manner. Many of the specific, mechanical details have not been shown since the person skilled in the art should be familiar with these details.

Although particular features have been shown and described, it will be understood that they are not intended to limit the claimed invention, and it will be made obvious to those skilled in the art that various changes and modifications may be made without departing from the scope of the claimed invention. The specification and drawings are, accordingly to be regarded in an illustrative rather than restrictive sense. The claimed invention is intended to cover all alternatives, modifications and equivalents.

LIST OF PARTS

P pinna of user
EC ear canal of user
T tympanic membrane of user
1 hearing instrument, HI
1A hearing instrument, left hearing instrument (left HI), (HI shell with electronics
1A' left hearing instrument shell, (left HI shell)
1B hearing instrument, right hearing instrument (right HI shell), HI shell with electronics
1B' right hearing instrument shell (right HI shell)
4 second charger element, charger element of chargeable hearing instrument,
5 face plate
6 hearing instrument electronics
7 rechargeable cell
8 ear canal impression
8' dataset representing a shape of a portion of an ear canal of the user, virtual representation of ear canal portion, virtual model of ear canal portion
9 receiver
10 3D scanner
11 PC with keyboard, mouse and suitable 3D modeling software
12 3D printer
20 hearing Instrument charger device/HI charger device
21 charger casing
22 first charger coil, charger coil of hearing instrument charger device for right hearing instrument
23 first charger coil, charger coil of hearing instrument charger device for left hearing instrument
24 cable connecting charger electronics to charger coils of hearing instrument charger device
25 charger power supply
26 charger casing base
27 charger lid
28 charger electronic components
29 receiving portion of charger casing, rim
40 charger insert part
41 plate portion of charger insert part
45 holder for receiving a chargeable hearing instrument
46 holder portion of charger insert part
50 volume added to inlay to remove undercut
51 undercut surface
70 first virtual model, virtual model of the rechargeable hearing instrument, dataset representing the rechargeable hearing instrument
80 second virtual model, virtual model of the charger insert part, dataset representing the charger insert part
100 System

The invention claimed is:

1. A method of manufacturing a charger insert part of a hearing instrument charger device, the charger insert part comprising a holder for holding a rechargeable hearing instrument, the hearing instrument charger device comprising a charger casing having a receiving portion for receiving the charger insert part, and a first charger element in the charger casing, the method comprising:

obtaining a first virtual model of the rechargeable hearing instrument shaped or to be shaped to at least partly conform to a shape of a portion of an ear canal of a user, wherein the first virtual model comprises an allocated position for a second charger element;

obtaining a second virtual model of the charger insert part, the second virtual model being based on the first virtual model, wherein the second virtual model of the charger insert part is for manufacturing the charger insert part, such that when the charger insert part is placed in the receiving portion, the first charger element will be in a relation with the second charger element; and shaping, by a manufacturing process, the charger insert part based on the second virtual model.

2. The method according to claim 1, wherein the second virtual model of the charger insert part is based on data regarding a shape of the charger casing.

3. The method according to claim 1, wherein the second virtual model of the charger insert part is based on data regarding a position of the first charger element.

4. The method according to claim 1, wherein the second virtual model of a charger insert part comprises a model of the holder, wherein the model of the holder is based on a predetermined orientation of the holder relative to the charger casing.

5. The method according to claim 1, wherein the second virtual model of the charger insert part is based on the allocated position for the second charger element in the first virtual model.

6. The method according to claim 1, wherein the second virtual model comprises a model of the holder, and wherein at least a subset of surface portions in the model of the holder is identical to corresponding surface portions of the first virtual model of the rechargeable hearing instrument.

7. The method according to claim 6, wherein the second virtual model is created by removing undercut surfaces of the holder in the second virtual model.

8. The method according to claim 1, wherein the second virtual model of the charger insert part is designed digitally on a computer.

9. The method according to claim 1, wherein the first virtual model of the rechargeable hearing instrument is designed digitally on a computer.

10. The method according to claim 1, wherein the second charger element of the rechargeable hearing instrument is formed, or is to be formed, at an externally facing face plate of the rechargeable hearing instrument, the externally facing face plate having a planar surface; and wherein the second virtual model of the charger insert comprises a model feature representing an upwardly facing surface of the charger insert that is substantially parallel to the planar surface of the externally facing face plate when the rechargeable hearing instrument is held in the holder of the charger insert to be manufactured.

11. The method according to claim 1, wherein the position of the first charger element is in a fixed, standardized position in the charger casing.

12. The method according to claim 11, wherein the charger casing has a fixed, standardized shape and size.

13. The method according to claim 1, wherein the charger casing comprise a box-shaped charger base and a charger lid configured for covering the charger base, and wherein the first charger element is at the charger lid.

14. The method according to claim 1, wherein the first charger element is a first charger coil, and the second charger element is second charger coil.

15. The method according to claim 1, wherein the charger insert part comprising the holder is formed from a block of material by milling away material from the block of material.

16. The method according to claim 1, wherein the charger insert part with the holder is formed by an additive manufacturing process.

17. The method according to claim 16, wherein the charger insert part comprises a plate portion and a holder portion, wherein the holder portion extends from the plate portion, and wherein the plate portion is formed before the holder portion.

18. The method according to claim 1, wherein the the charger insert part comprising the holder is formed using a biocompatible material.

19. The method according to claim 1, further comprising obtaining a dataset representing the shape of the portion of the ear canal by:

inserting a portion of a pliable material into the ear canal of the user for forming an ear canal impression; and scanning the ear canal impression to create the dataset representing the shape of the portion of the ear canal.

20. The method according to claim 1, further comprising obtaining a dataset representing the shape of the portion of the ear canal by scanning the portion of the ear canal.

21. The method according to claim 1, wherein the rechargeable hearing instrument is customized for the user.

22. The charger insert part with the holder formed by the method according to claim 1.

23. The hearing instrument charger device comprising the charger insert part with the holder formed by the method according to claim 1.

24. A method of manufacturing a charger insert part of a hearing instrument charger device, the charger insert part comprising a holder for holding a rechargeable hearing instrument, the hearing instrument charger device comprising a charger casing having a receiving portion for the charger insert part, and a first charger element in the charger casing, the method comprising:

obtaining a first virtual model of the rechargeable hearing instrument shaped or to be shaped to at least partly conform to a shape of a portion of an ear canal of a user, wherein the first virtual model comprises an allocated position for a second charger element;

obtaining a second virtual model of the charger insert part, the second virtual model being based on the first virtual model, wherein the second virtual model of the charger insert part is for manufacturing the charger insert part, such that when the charger insert part is placed in the receiving portion, the first charger element will be in a relation with the second charger element; and providing the second virtual model for manufacturing the charger insert part based on the second virtual model.

25. The method according to claim 1, wherein the first virtual model is a computer model.

26. The method according to claim 1, wherein the second virtual model is a computer model.

27. The method according to claim 1, wherein the second virtual model of the charger insert part is for manufacturing the charger insert part, such that when the charger insert part is placed in the receiving portion, the first charger element will be at a distance from the second charger element.

28. The method according to claim 1, wherein the shaped charger insert is for the hearing instrument charger device that is configured to provide wireless charging power.

29. The method according to claim 1, wherein the act of shaping comprises removing materials.

30. The method according to claim 1, wherein the act of shaping is performed by creating the charger insert having a certain shape.

\* \* \* \* \*